United States Patent
Takahashi et al.

(10) Patent No.: US 12,368,068 B2
(45) Date of Patent: Jul. 22, 2025

(54) METHOD OF MANUFACTURING SEMICONDUCTOR DEVICE

(71) Applicant: FUJI ELECTRIC CO., LTD., Kawasaki (JP)

(72) Inventors: Yuya Takahashi, Matsumoto (JP); Shunsuke Tanaka, Matsumoto (JP); Kohichi Hashimoto, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 672 days.

(21) Appl. No.: 17/334,148

(22) Filed: May 28, 2021

(65) Prior Publication Data

US 2022/0020628 A1 Jan. 20, 2022

(30) Foreign Application Priority Data

Jul. 14, 2020 (JP) .................. 2020-120794

(51) Int. Cl.
*H01L 21/683* (2006.01)
*H01L 21/288* (2006.01)

(52) U.S. Cl.
CPC ........ *H01L 21/6836* (2013.01); *H01L 21/288* (2013.01); *H01L 2221/68386* (2013.01)

(58) Field of Classification Search
CPC . H01L 21/6835–68792; H01L 21/6836; H01L 21/288; H01L 21/6838;

(Continued)

(56) References Cited

U.S. PATENT DOCUMENTS

2011/0256668 A1 10/2011 Urano
2012/0219713 A1* 8/2012 Sferlazzo .......... C23C 16/45565
118/725

(Continued)

FOREIGN PATENT DOCUMENTS

JP 2011-222898 A 11/2011
JP 2014-086667 A 5/2014

(Continued)

OTHER PUBLICATIONS

Japanese Office Action dated Jun. 4, 2024, in the counterpart Japanese Patent Application No. 2020-120794.

*Primary Examiner* — Julio J Maldonado
*Assistant Examiner* — Stanetta D Isaac
(74) *Attorney, Agent, or Firm* — Rabin & Berdo, P.C.

(57) ABSTRACT

A method of manufacturing a semiconductor device, including preparing a semiconductor wafer having a first main surface and a second main surface opposite to each other, forming a first electrode on the first main surface of the semiconductor wafer, applying a first tape to the second main surface of the semiconductor wafer, so as to cover the second main surface of the semiconductor wafer with the first tape, applying a second tape to an outer peripheral portion of the semiconductor wafer, to thereby cover an end of the semiconductor wafer with the second tape, heating the semiconductor wafer having the first tape and the second tape applied thereto, by a heat treatment at a temperature of at least 40 degrees C., and forming a plating layer on a surface of the first electrode after heating the semiconductor wafer.

11 Claims, 11 Drawing Sheets

(58) Field of Classification Search
CPC ...... C25D 17/001; C25D 7/123; C25D 5/022; C23C 18/1601–1632; C23C 18/1653
See application file for complete search history.

(56) References Cited

U.S. PATENT DOCUMENTS

| | | | |
|---|---|---|---|
| 2014/0120716 A1* | 5/2014 | Sakaguchi | H01L 29/66333 |
| | | | 438/652 |
| 2016/0240504 A1 | 8/2016 | Sakaguchi | |
| 2018/0151508 A1 | 5/2018 | Nakamura et al. | |
| 2019/0184460 A1* | 6/2019 | Honda | C23C 28/04 |
| 2020/0090974 A1* | 3/2020 | Seddon | H01L 21/67248 |

FOREIGN PATENT DOCUMENTS

| | | |
|---|---|---|
| JP | 2016-058677 A | 4/2016 |
| JP | 2016-152317 A | 8/2016 |
| JP | 2018088439 A | 6/2018 |

* cited by examiner

METHOD OF MANUFACTURING SEMICONDUCTOR DEVICE

CROSS REFERENCE TO RELATED APPLICATIONS

This application is based upon and claims the benefit of priority of the prior Japanese Patent Application No. 2020-120794, filed on Jul. 14, 2020, the entire contents of which are incorporated herein by reference.

BACKGROUND OF THE INVENTION

1. Field of the Invention

Embodiments of the invention relate to a method of manufacturing a semiconductor device.

2. Description of the Related Art

Conventionally, in a vertical-type semiconductor device having surface electrodes (electrode pads) on both main surfaces, a wiring structure is known in which respectively different external-connection terminals (for example, terminal pins or copper foil plates) are soldered to a front electrode and a back electrode. By soldering the front electrode and the external-connection terminal, high-density mounting of a module package, current density enhancement, reduced wiring capacitance for faster switching, enhancement of semiconductor device element cooling efficiency, etc. may be realized as compared to an instance in which the front electrode and the external-connection terminal are connected by wire bonding.

The front electrode, normally, is formed using a metal containing highly conductive aluminum (Al), Aluminum is inferior for solder wetting and therefore, a metal layer (for example, a nickel (Ni) layer) having favorable solder wetting is formed on the surface of the front electrode to enhance the solder wetting of the surface of the front electrode, whereby bonding reliability at an interface between the front electrode and solder layer is enhanced. As a method of forming a metal layer having favorable solder wetting on a front electrode, a plating process by an electroplating method or an electroless plating method is known.

As a method of performing a plating process to a predetermined part of a semiconductor wafer, a method of performing a plating process in a state in which tape is applied to a part of the semiconductor wafer where no plating layer is to be formed has been proposed (for example, refer to Japanese Laid-Open Patent Publication No. 2014-086667, Japanese Laid-Open Patent Publication No. 2016-152317, Japanese Laid-Open Patent Publication No. 2016-058677, and Japanese Laid-Open Patent Publication No. 2011-222898). In Japanese Laid-Open Patent Publication No. 2014-086667, Japanese Laid-Open Patent Publication No. 2016-152317, Japanese Laid-Open Patent Publication No. 2016-058677, and Japanese Laid-Open Patent Publication No. 2011-222898, parts of the semiconductor wafer where no plating layer is to be formed (back electrode, wafer outer periphery) are covered and protected by tape, whereby deposition of a plating layer to parts where no plating layer is to be formed (hereinafter, abnormal deposition), changes in bath composition over time, plating bath contamination due to abnormal deposition and peeling of a plating layer, etc. may be prevented.

Further, in Japanese Laid-Open Patent Publication No. 2014-086667 and Japanese Laid-Open Patent Publication No. 2016-152317, in an instance in which a semiconductor wafer having a rib-shape in which a thickness of a center portion is thinned and an outer peripheral portion is left thickly for a predetermined width, a step is generated at the back surface of the semiconductor wafer due to this difference in thicknesses of the center portion and the outer peripheral portion of the semiconductor wafer, and a first tape is applied to an entire area of a back surface of the semiconductor wafer so as to be adhered to an inclined surface of the step and a flat portion of the back surface of the semiconductor wafer, the flat portion being further outward than is the step. It is disclosed that on the first tape in the flat portion of the back surface in the outer peripheral portion of the semiconductor wafer, a second tape is applied in the outer peripheral portion of the semiconductor wafer so as to overlap the first tape.

Further, Japanese Laid-Open Patent Publication No. 2014-086667, Japanese Laid-Open Patent Publication No. 2016-152317, and Japanese Laid-Open Patent Publication No. 2011-222898 disclose use of a UV tape having an adhesive layer that hardens and whose adhesive strength decreases with ultraviolet (UV) irradiation, as the tape applied to the semiconductor wafer. Further, in Japanese Laid-Open Patent Publication No. 2011-222898, when the tape is applied to the back surface of the semiconductor wafer, the semiconductor wafer to which a thinning process has been performed is heated in a range from 40 degrees C. to 60 degrees C., is maintained in a warped state with a front side thereof protruding, and a plating process is performed to the semiconductor wafer in this warped state with the front side thereof protruding, whereby warping of the semiconductor wafer after the tape is peeled is reduced.

SUMMARY OF THE INVENTION

According to an embodiment of the invention, a method of manufacturing a semiconductor device, includes: preparing a semiconductor wafer, the semiconductor wafer having a first main surface and a second main surface opposite to each other; forming a first electrode on the first main surface of the semiconductor wafer; applying a first tape to the second main surface of the semiconductor wafer, so as to cover the second main surface of the semiconductor wafer with the first tape; applying a second tape to an outer peripheral portion of the semiconductor wafer, to thereby cover the outer peripheral portion of the semiconductor wafer with the second tape; heating the semiconductor wafer having the first tape and the second tape applied thereto, by a heat treatment at a temperature of at least 40 degrees C.; and forming a plating layer on a surface of the first electrode after heating the semiconductor wafer.

Objects, features, and advantages of the present invention are specifically set forth in or will become apparent from the following detailed description of the invention when read in conjunction with the accompanying drawings.

DETAILED DESCRIPTION OF THE INVENTION

First, problems associated with the conventional techniques are discussed. In the conventional plating process methods described above, even when the plating process is performed in state in which the parts of the semiconductor wafer where a plating layer is not to be formed (back surface and outer peripheral portion of the semiconductor wafer) are covered with tape, the following three problems were found to occur through the earnest research of the inventors. A first problem is that plating solution permeates between the back surface of the semiconductor wafer and the tape, and in the outer peripheral portion of the semiconductor wafer, appearance defects due to plating solution "blemishes" occur at the back electrode. The inventors verified causes of this first problem using a rib-shaped semiconductor wafer.

Figure 16A:
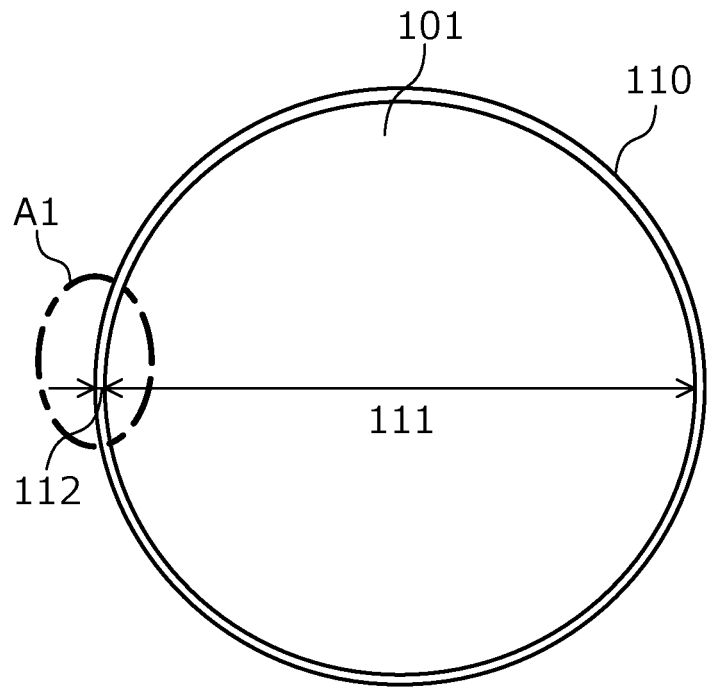
FIG. 16A is a plan view schematically depicting a state of a semiconductor wafer as viewed from a back surface thereof after a conventional plating process.
Figure 16B:
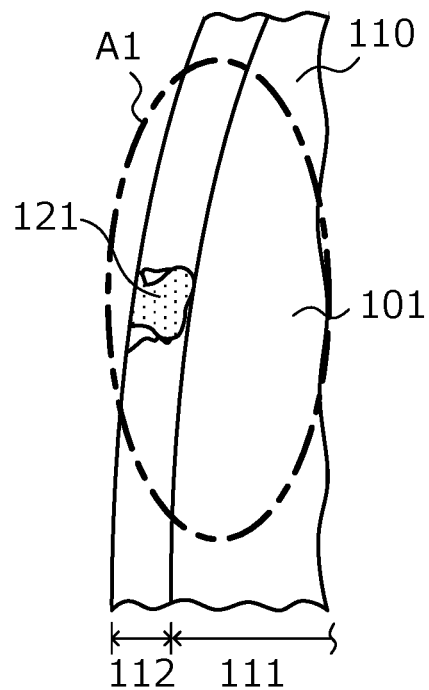
FIG. 16B is a plan view schematically depicting a state of the semiconductor wafer as viewed from the back surface thereof after the conventional plating process.
Figure 17A:
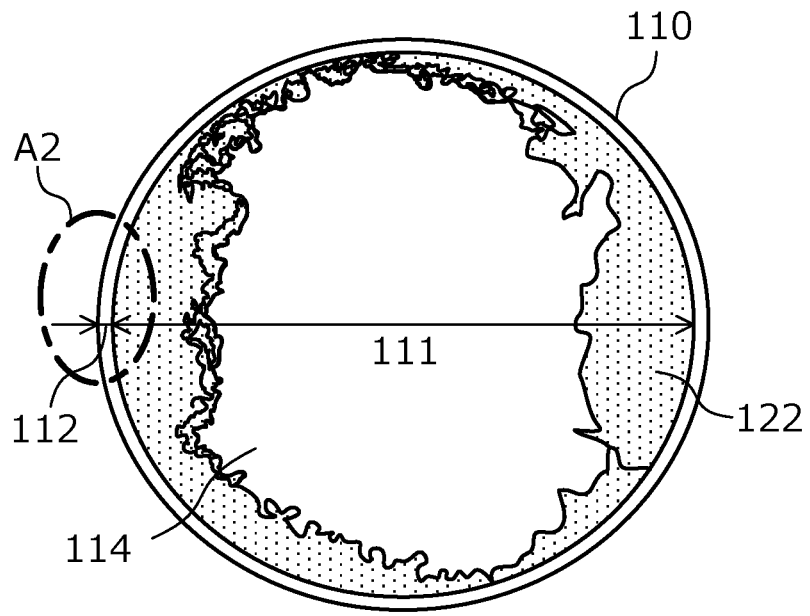
FIG. 17A is a plan view schematically depicting a state of the semiconductor wafer as viewed from the back surface thereof after the conventional plating process.
Figure 17B:
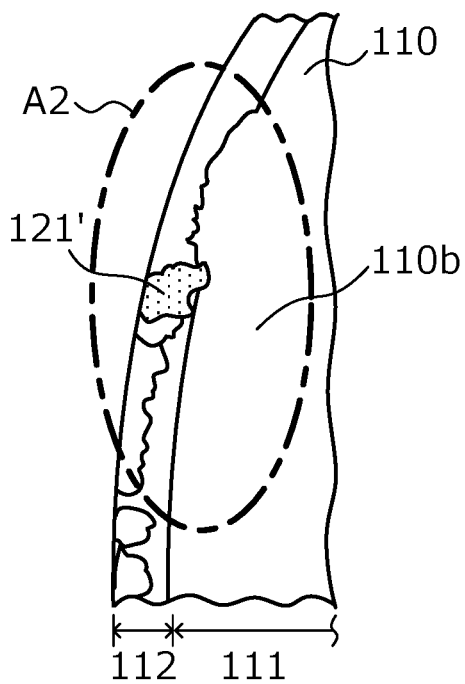
FIG. 17B is a plan view schematically depicting a state of the semiconductor wafer as viewed from the back surface thereof after the conventional plating process.
Figure 18:
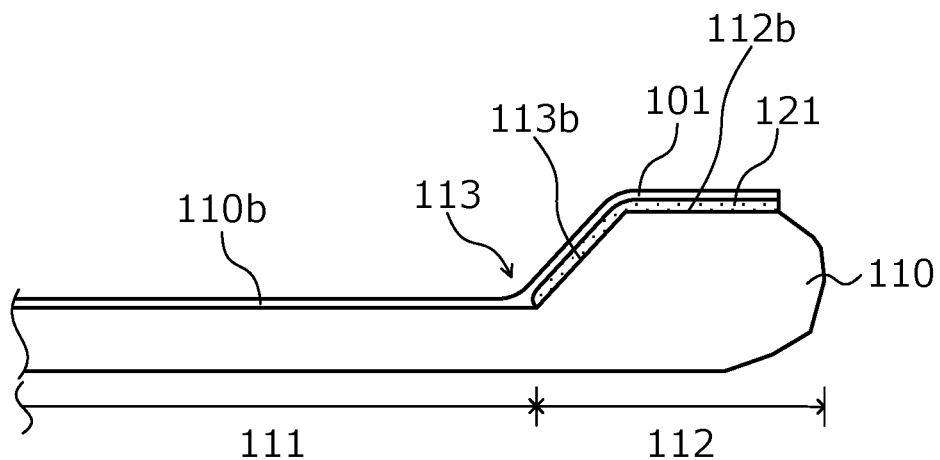
FIG. 18 is a cross-sectional view depicting a structure of portions surrounded by frame A1 in FIGS. 16A and 16B.
Figure 19:
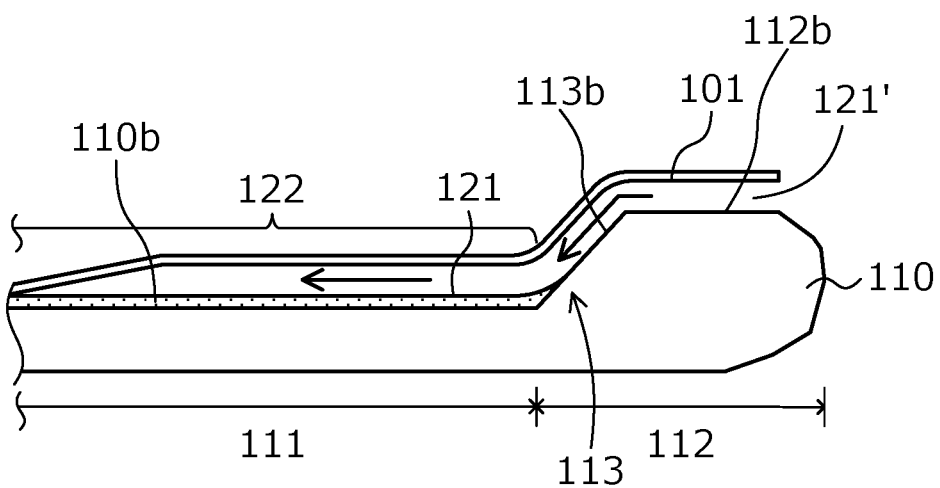
FIG. 19 is a cross-sectional view depicting a structure of portions respectively surrounded by frame A2 in FIGS. 17A and 17B.

FIGS. 16A, 16B, 17A, and 17B are plan views schematically depicting states of a semiconductor wafer as viewed from a back surface thereof after the conventional plating process. FIG. 16A depicts a state of a back surface of a semiconductor wafer 110 after a second tape applied to an outer peripheral portion of the semiconductor wafer is peeled but before a first tape 101 is peeled. FIG. 17A depicts a state of a back electrode 114 of the semiconductor wafer 110 after the first tape applied to an entire area of the back surface of the semiconductor wafer is peeled. FIGS. 16B and 17B are enlarged views of portions respectively surrounded by frames A1 and A2 in FIGS. 16A and 17A, respectively. FIGS. 18 and 19 are cross-sectional views depicting a structure of the portions respectively surrounded by frames A1 and A2 in FIGS. 16A, 16B, 17A, and 17B.

The semiconductor wafer 110 having a rib-shaped is a semiconductor wafer having a thickness that is made thinner in a center portion 111 from a back surface 110*b* and the thickness, as compared to the center portion 111, is left thicker in an outer peripheral portion 112 of a predetermined width along an outer periphery. According to the plating process method described in Japanese Laid-Open Patent Publication No. 2014-086667 and Japanese Laid-Open Patent Publication No. 2016-152317, the first tape 101 was applied to an entire area of the back surface 110*b* of the semiconductor wafer 110 so as to adhere to an inclined surface 113*b* of a step 113 generated at the back surface 110*b* by the difference in thickness between the center portion 111 and the outer peripheral portion 112 of the semiconductor wafer 110, and a flat portion 112*b* of the back surface 110*b* of the semiconductor wafer 110, further outward than the step 113 (hereinafter, back-surface flat portion of the outer peripheral portion 112 of the semiconductor wafer 110).

After application of the first tape 101, in the back-surface flat portion 112*b* of the outer peripheral portion 112 of the semiconductor wafer 110, a second tape (not depicted) was applied to the outer peripheral portion 112 of the semiconductor wafer 110 so as to overlap the first tape 101. Further, after a plating process for the front electrode of the semiconductor wafer 110, the first tape 101 was peeled after the second tape was peeled. The first tape 101 was a UV tape and the first tape 101 was peeled from the back surface 110*b* of the semiconductor wafer 110 after an adhesive layer of the first tape 101 was hardened and the adhesive strength thereof was reduced by UV irradiation of the first tape 101.

Results thereof confirm that at the back electrode 114 of the semiconductor wafer 110 after the peeling of the first tape 101, an appearance defect 122 (hatched portion) due to a plating solution "blemish" occurred over a wide range of the entire periphery along an end of the semiconductor wafer 110 (FIG. 17A). In the semiconductor wafer 110, it was confirmed that in the outer peripheral portion 112 of the semiconductor wafer 110 after the peeling of the second tape, a plating solution 121 (hatched portion) partially penetrated and accumulated between the back surface of the semiconductor wafer 110 and the first tape 101 (FIG. 16B). Also, in a part (hatched portion) 121' where the plating solution 121 accumulated, an appearance defect due to the plating solution 121 occurred (FIG. 17B).

In an instance in which the plating solution 121 (hatched portion) accumulates between the back surface 110*b* of the semiconductor wafer 110 and the first tape 101 (FIG. 18), it is presumed that at the timing when the first tape 101 floats from the semiconductor wafer 110 due to gas generated from the adhesive layer of the first tape 101 during the UV irradiation, the plating solution 121 migrates between the back surface 110b of the semiconductor wafer 110 and the first tape 101, from the back-surface flat portion 112b of the outer peripheral portion 112 of the semiconductor wafer 110 and along the inclined surface (mesa edge) 113b of the step 113, to the center portion 111 and permeates (is absorbed in) a wide range of the back electrode (FIG. 19), thereby generating the appearance defect 122.

A second problem is that the plating solution penetrates between the outer peripheral portion of the semiconductor wafer and the second tape, permeates the outer peripheral portion of the semiconductor wafer, and at a process after the plating process, a wafer ID (identification: engraved mark for identifying the semiconductor wafer) formed in the outer peripheral portion of the semiconductor wafer cannot be automatically read. A third problem is that the plating solution penetrates between the outer peripheral portion of the semiconductor wafer and the second tape, thereby precipitating an unnecessary plating layer in the outer peripheral portion of the semiconductor wafer (abnormal deposition).

A plating layer abnormally deposited in the outer peripheral portion of the semiconductor wafer peels from the semiconductor wafer, floats in the plating bath, thereby causing plating bath contamination and changes in bath composition over time, and again attaches to the semiconductor wafer, thereby causing appearance defect of the front electrode. With appearance defects of the front electrode and the back electrode due to plating solution "blemishes", solder joint defects occur, possibly causing fatal defects in the semiconductor device, and yield (product production volume) decreases. Due to errors in the automated reading of the wafer ID, manufacturing process throughput decreases. Due to plating bath contamination, changes in bath composition over time, etc., the frequency of plating tank cleaning increases and the lifetime of the plating solution decreases.

Embodiments of a method of manufacturing a semiconductor device according to the present invention will be described in detail with reference to the accompanying drawings. In the description of the embodiments below and the accompanying drawings, main portions that are identical will be given the same reference numerals and are not repeatedly described.

Figure 1:
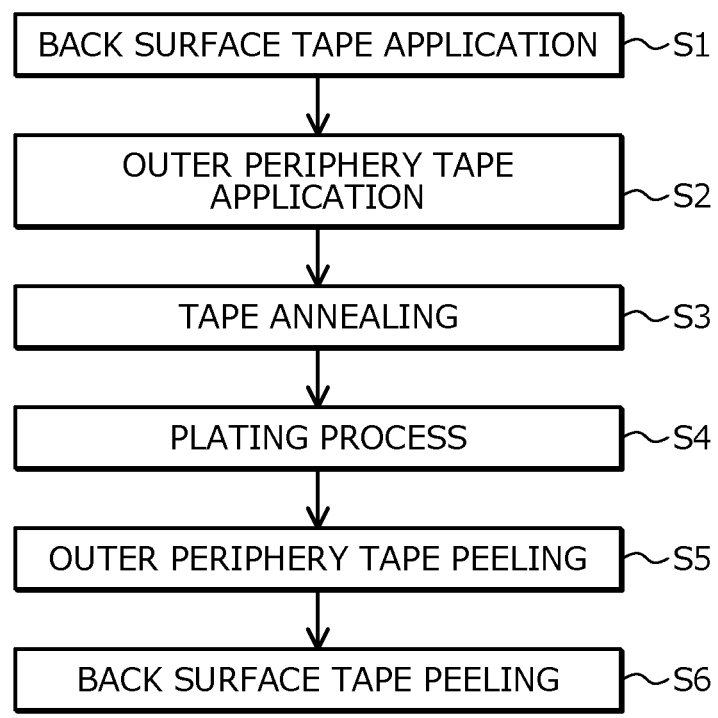
FIG. 1 is a flowchart depicting an outline of a method of manufacturing a semiconductor device according to an embodiment.
Figure 2:
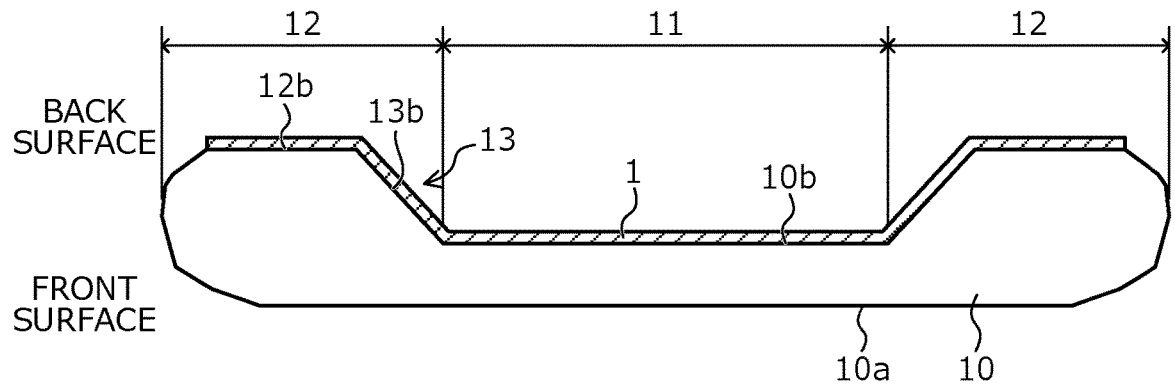
FIG. 2 is a cross-sectional view depicting a state of the semiconductor device according to the embodiment during manufacture.
Figure 3:
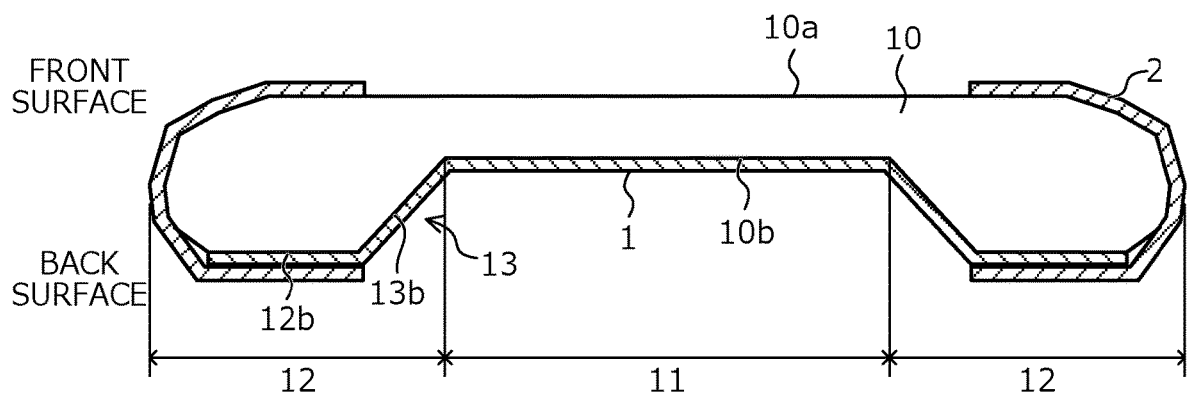
FIG. 3 is a cross-sectional view depicting a state of the semiconductor device according to the embodiment during manufacture.
Figure 4:
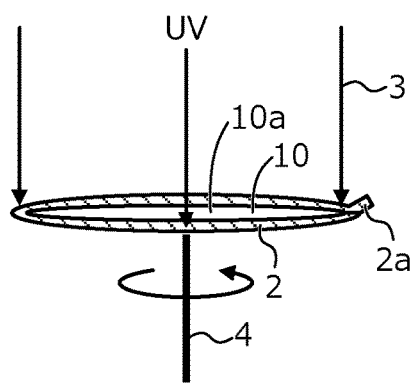
FIG. 4 is a bird's eye view of a state of the semiconductor device according to the embodiment during manufacture.
Figure 5:
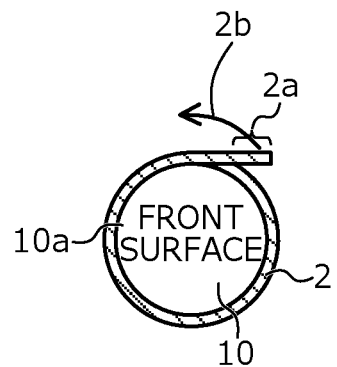
FIG. 5 is a plan view of a state of the semiconductor device according to the embodiment during manufacture.
Figure 6:
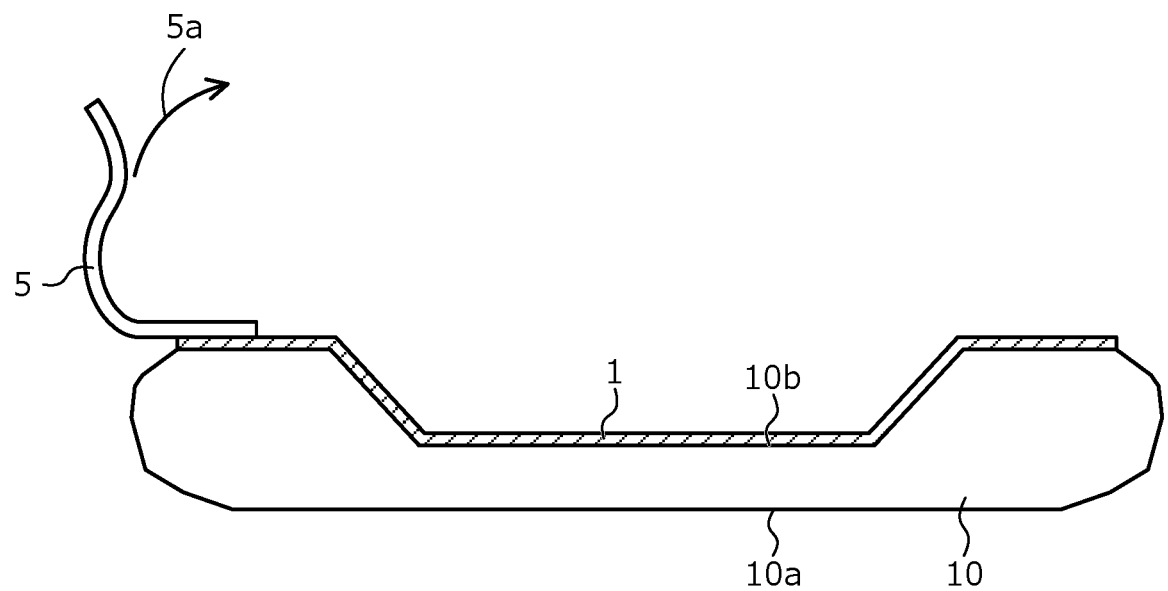
FIG. 6 is a cross-sectional view depicting a state of the semiconductor device according to the embodiment during manufacture.

A method of manufacturing a semiconductor device according to an embodiment is described taking, as an example, an instance in which a plating process is performed to a rib-shaped semiconductor wafer. FIG. 1 is a flowchart depicting an outline of the method of manufacturing the semiconductor device according to the embodiment, FIGS. 2, 3, and 6 are cross-sectional views depicting states of the semiconductor device according to the embodiment during manufacture. FIG. 4 is a bird's eye view of a state of the semiconductor device according to the embodiment during manufacture. FIG. 5 is a plan view of a state of the semiconductor device according to the embodiment during manufacture.

FIGS. 2, 3, and 6 respectively depict states of a semiconductor wafer 10 during processes at steps S1, S2, S6 in FIG. 1. FIGS. 4 and 5 depict states of the semiconductor wafer 10 during a process at step S5 in FIG. 1. As described hereinafter, the semiconductor wafer 10 having a rib-shaped is fabricated by grinding and thinning a center portion of the semiconductor wafer 10 having a substantially uniform thickness, the center portion is ground and thinned from a back surface (second main surface) 10b at an arbitrary timing during manufacture of the semiconductor device, and an outer peripheral portion 12 of a predetermined width along an outer periphery is left to be thicker than a center portion 11. A substantially uniform thickness means a same thickness within a range including allowable error due to process variation.

First, by a general method, at a front surface (first main surface) 10a of the semiconductor wafer 10 having a substantially uniform thickness, predetermined front device element structures (not depicted) are respectively formed in chip regions (not depicted) of the center portion 11 of the semiconductor wafer 10. A chip region is a portion that becomes a semiconductor chip after the semiconductor wafer 10 is diced (cut) into individual semiconductor chips. The predetermined front device element structures are functional portions for obtaining various functions of the semiconductor device and insulating layers that electrically insulate the functional portions from one another; the predetermined front device element structures are configured by portions of surface regions of the semiconductor wafer 10 at the front surface 10a thereof, and surface electrodes, insulating layers, etc. on the front surface 10a of the semiconductor wafer 10.

A portion of the surface regions at the front surface 10a of the semiconductor wafer 10 is, for example, a bipolar transistor, an insulated gate bipolar transistor (IGBT), parts of MOS gates of a metal oxide semiconductor field effect transistor (MOSFET) having insulated gates (MOS gates) having a three-layered structure including a metal, an oxide film, and a semiconductor, an anode region of a diode.

On an outermost surface of the front surface 10a of the semiconductor wafer 10, front electrodes (surface electrodes, not depicted) containing aluminum (Al) are formed in the chip regions, respectively. The front electrodes are emitter electrodes in the bipolar transistor and the IGBT, a source electrode in the MOSFET, and an anode electrode in the diode, and function as an electrode pad to which an external-connection terminal (for example, terminal pins, copper foil plate, etc.) is soldered. The front surface 10a of the semiconductor wafer 10, excluding the front electrodes, is covered by an insulating layer such as an interlayer insulating film 23, a passivation film 24 (refer to FIGS. 7 and 8), etc.

In the outer peripheral portion 12 of the semiconductor wafer 10, on the front surface 10a of the semiconductor wafer 10 or the insulating layer on the front surface 10a of the semiconductor wafer 10, a wafer ID (engraved mark for identifying the semiconductor wafer 10) is formed by, for example, a laser marker (not depicted). Next, the center portion 11 of the semiconductor wafer 10 is ground from the back surface 10b (back grinding) to a position corresponding to a thickness for use as a semiconductor device and is thereby made thinner. As a result, the semiconductor wafer 10 has a rib-shape in which only the thickness of the center portion 11 is thinned and the outer peripheral portion 12 of a predetermined thickness along the outer periphery is left thickly (refer to FIG. 2).

In the description hereinafter, the semiconductor wafer 10 having a rib-shaped is indicated as simply the semiconductor wafer 10". At the back surface 10b of the semiconductor wafer 10, a step 13 is generated by the difference in thicknesses of the center portion 11 and the outer peripheral portion 12. A portion from the step 13 to an end of the semiconductor wafer 10 is the outer peripheral portion 12 of the semiconductor wafer 10. The outer peripheral portion 12 of the semiconductor wafer 10 is used as a reinforcing member to maintain the strength of the semiconductor wafer 10 during manufacture of the semiconductor device. In the outer peripheral portion 12 of the semiconductor wafer 10, no chip region is formed. While a width of the outer peripheral portion 12 may be suitably adjusted, for example, the width is in a range from about 2 mm to 6 mm.

A portion of the back surface 10b of the semiconductor wafer 10 further outward (closer to the wafer end) than is the step 13 (hereinafter, back-surface flat portion 12b of the outer peripheral portion 12 of the semiconductor wafer 10) is left as a flat surface. A portion of the back surface 10b of the semiconductor wafer 10 between the center portion 11 and the back-surface flat portion 12b of the outer peripheral portion 12 (mesa edge of the step 13) may be an inclined surface 13b sloped with respect to the back surface 10b of the semiconductor wafer 10 so as that a thickness of the outer peripheral portion 12 of the semiconductor wafer 10 progressively increases in direction from the center portion 11 outwardly toward the wafer end. A width of the outer peripheral portion 12 of the semiconductor wafer 10 may be preferably in a range from about 2.5 mm to 5.0 mm.

Next, an entire area of the back surface of the semiconductor wafer 10 is uniformly removed by etching, whereby damage occurring to the ground back surface of the semiconductor wafer 10 is removed. For example, an entire area of the back surface of the semiconductor wafer 10 may be removed about 10 µm to 30 µm using a mixed acid etching solution. Next, after the semiconductor wafer 10 is cleaned by a general method, at the back surface 10b of the semiconductor wafer 10, predetermined back device element structures are respectively formed in the chip regions of the center portion 11 of the semiconductor wafer 10. The predetermined back device element structures are functional portions for obtaining various functions of the semiconductor device and insulating layers that electrically insulate the functional portions from one another; the predetermined back device element structures are configured by portions of surface regions of the semiconductor wafer 10 at the back surface 10b thereof, and surface electrodes on the back surface 10b of the semiconductor wafer 10.

A portion of the surface regions at the back surface 10b of the semiconductor wafer 10 is a buffer region, a collector region of the bipolar transistor or the IGBT, a drain region of the MOSFET, and a cathode region of the diode. At an outermost surface of the back surface 10b of the semiconductor wafer 10, a back electrode (surface electrode, not depicted) is formed in an entire area of the back surface 10b, spanning the center portion 11, the inclined surface 13b of the step 13, and the back-surface flat portion 12b of the outer peripheral portion 12. The back electrode is a collector electrode of the bipolar transistor or IGBT, a drain electrode of the MOSFET, and a cathode electrode of the diode.

The back electrode, for example, is formed by an aluminum layer, a titanium (Ti) layer, a nickel (Ni) layer, and a gold (Au) layer that are sequentially stacked by a sputtering method. While the state up to here is not depicted, refer to FIG. 2 regarding parts appended with reference characters. Next, a first tape 1 (back surface tape) is applied to an entire area of the outermost surface of the back surface 10b of the semiconductor wafer 10 (surface of the back electrode), whereby an entire area of the back electrode of the semiconductor wafer 10 is covered and protected by the first tape 1 (step S1, FIG. 2, second process). Processes at steps S1 to S6 depicted in FIG. 1 and described hereinafter may be performed after formation of the front electrode but before formation of the back electrode. In this instance, the first tape 1 is applied directly to the back surface 10b of the semiconductor wafer 10.

The first tape 1 is applied to the center portion 11 of the semiconductor wafer 10, the inclined surface 13b of the step 13, and the back-surface flat portion 12b of the outer peripheral portion 12 so as to cover an entire area of the back surface 10b of the semiconductor wafer 10. The first tape 1, for example, in a plan view thereof, has a circular shape with a diameter substantially equal to a diameter of the semiconductor wafer 10. A diameter substantially equal to the diameter of the semiconductor wafer 10 may preferably be a diameter such that, for example, in a state in which the first tape 1 is applied to the back surface 10b of the semiconductor wafer 10, the first tape 1 does not extend outside beyond the end of the semiconductor wafer 10 and is not more than 1.5 mm from the end of the semiconductor wafer 10 in a direction toward the center portion 11 of the semiconductor wafer. Further, while an end of the first tape 1 preferably matches and overlaps a border between an outer peripheral end portion (chamfered portion (reference character not depicted)) and the back-surface flat portion 12b, the end of the first tape 1 may protrude therebeyond. By the end of the first tape 1 matching and overlapping the border between the outer peripheral end portion and the back-surface flat portion 12b, the adhesive strength of the first tape 1 and the semiconductor wafer 10 may be increased. Further, the adhesive strength of the first tape 1 and a second tape 2 may be increased.

The first tape 1 is a UV tape that transmits UV and has an adhesive layer that, by ultraviolet (UV) irradiation, is hardened and whose adhesive strength is reduced. The first tape 1 has the adhesive layer (not depicted) in an entire area of one surface of a base material having, in a plan view thereof, a circular shape having a diameter substantially equal to a diameter of the semiconductor wafer 10, and the adhesive layer is applied to the semiconductor wafer 10. For the first tape 1, a material having heat resistance and chemical resistance to a plating solution of a later-described plating process is used. The first tape 1 may be formed by a same material as that of the second tape 2 described hereinafter.

Next, the second tape 2 is applied to the outer peripheral portion 12 of the semiconductor wafer 10, whereby an entire area of the end of the semiconductor wafer 10 is covered and protected by the second tape 2 (outer periphery tape) (step S2, FIG. 3, third process). The second tape 2 is applied from the front surface 10a of the semiconductor wafer 10 to the back surface 10b so as to sandwich the end of the semiconductor wafer 10. The second tape 2 is applied to the front surface 10a of the semiconductor wafer 10 (or the insulating layer on the front surface 10a) in the outer peripheral portion 12 of the semiconductor wafer 10 and is applied to the first tape 1 on the back-surface flat portion 12b.

The second tape 2, in a plan view thereof, has a substantially rectangular band-like shape longer than the outer periphery (circumference) of the semiconductor wafer 10. The second tape 2 has a first end in a lateral direction positioned on the front surface 10a of the semiconductor wafer 10, a second end in the lateral direction positioned on the first tape 1 in the back-surface flat portion 12b of the outer peripheral portion 12 of the semiconductor wafer 10, and covers the end or chamfered portion (reference character not depicted) of the semiconductor wafer 10. The chamfered portion of the semiconductor wafer 10 is a portion having a substantially arc-shape between the end and the front surface 10a, and the end and the back surface 10b of the semiconductor wafer 10.

The first end of the second tape 2 in the lateral direction is positioned in the flat portion of the front surface 10*a* closer to the center portion 11 than is the chamfered portion and does not reach the center portion 11 of the semiconductor wafer 10. The second end of the second tape 2 in the lateral direction overlaps the first tape 1 so as to completely cover the back-surface flat portion 12*b* of the outer peripheral portion 12 of the semiconductor wafer 10. For example, an amount that the second end of the second tape 2 in the lateral direction protrudes toward the center portion 11 from an inner side of the back-surface flat portion 12*b* of the outer peripheral portion 12 of the semiconductor wafer 10 may be preferably at most 1.5 mm. Further, while the second end of the second tape 2 in the lateral direction may preferably match and overlap the inner side of the back-surface flat portion 12*b* of the outer peripheral portion 12 of the semiconductor wafer 10 (side facing the center portion 11) (border between the back-surface flat portion 12*b* and the inclined surface 13*b*), the second end of the second tape 2 in the lateral direction may protrude therebeyond. The portion of the second tape 2 protruding toward the center portion 11 from the inner side of the back-surface flat portion 12*b* may be applied to the first tape 1 on the inclined surface 13*b*, A width of the second tape 2 in the lateral direction is, for example, about 6 mm and the second tape 2 may be applied with substantially half of the width thereof in the lateral direction positioned at the front surface 10*a* of the semiconductor wafer 10 and substantially half of the width thereof in the lateral direction positioned at the back surface 10*b*. As a result, the adhesive strength of the second tape 2 may be increased.

Further, the second tape 2, in a longitudinal direction, is applied so as to go around the outer periphery of the semiconductor wafer 10 at least one time. Ends of the second tape 2 in the longitudinal direction may overlap each other a predetermined amount. The amount that the ends of the second tape 2 in the longitudinal direction overlap each other, for example, may be preferably in a range from about 1 cm to 5 cm. As a result, the ends of the second tape 2 in the longitudinal direction may be adhered assuredly, whereby during the plating process, the second tape 2 does not easily peel from the semiconductor wafer 10. Further, one end of the second tape 2 in the longitudinal direction on and overlapping the other end thereof in the longitudinal direction may be left protruding (hereinafter, protruding portion, refer to FIG. 5) 2*a*. Leaving the protruding portion 2*a* of the second tape 2 in a protruding state facilitates peeling of the second tape 2.

The second tape 2 is a UV tape that transmits UV and has an adhesive layer that, by ultraviolet (UV) irradiation, is hardened and whose adhesive strength is reduced. The second tape 2 has the adhesive layer (not depicted) in an entire area of one surface of a base material having a substantially rectangular band-like planar shape longer than the outer periphery of the semiconductor wafer 10, and the adhesive layer is applied to the semiconductor wafer 10. The base material of the second tape 2 has elasticity enabling bending thereof so that no gap may occur between the base material and the semiconductor wafer 10. For the second tape 2, a material having heat resistance and chemical resistance to a plating solution of the later-described plating process is used.

Next, the semiconductor wafer 10 to which the first and the second tapes 1, 2 have been applied is heated (hereinafter, tape annealing) (step S3: the fourth process). By the tape annealing, the adhesive layers of the first and the second tapes 1, 2 are heated and the adhesive strength between the semiconductor wafer 10 and the first and the second tapes 1, 2 is increased. The higher is the temperature of the tape annealing, the greater the adhesive strength between the semiconductor wafer 10 and the first and the second tapes 1, 2 becomes. The temperature of the tape annealing is, for example, in a range from about 40 degrees C. to 80 degrees C. and may be at most a temperature of a later-described plating pretreatment and plating process.

By setting the temperature of the tape annealing to be at least the described lower limit, the adhesive strength between the semiconductor wafer 10 and the first and the second tapes 1, 2 increases and suppression of penetration of the plating solution of the later-described plating process, in between the semiconductor wafer 10 and the first and the second tapes 1, 2 is increased. When the temperature of the tape annealing exceeds the upper limit, the first and the second tapes 1, 2 become difficult to peel (peel strength increases) and the adhesive layers of the first and the second tapes 1, 2 tend to partially remain on the surface of the semiconductor wafer 10. Further, when the temperature of the tape annealing is too high, electrical characteristics of the semiconductor device may fluctuate.

In the present embodiment, the tape annealing is performed to the semiconductor wafer 10 to which the first and the second tapes 1, 2 have been applied, whereby the adhesive strength of the first and the second tapes 1, 2 is increased. As another method instead of the tape annealing, a method of increasing the adhesive strength by applying the first and the second tapes 1, 2 to the semiconductor wafer 10 that has been heated to a predetermined temperature is conceivable. However, to apply the first and the second tapes 1, 2 to the semiconductor wafer 10 that has been heated, manufacturing equipment becomes complicated and cost may increase, which is not desirable. Further, the first and the second tapes 1, 2 have a coefficient of thermal expansion that is large as compared to the semiconductor wafer 10. Therefore, by applying the first and the second tapes 1, 2 to the semiconductor wafer 10 that has been heated, as compared to an instance of the tape annealing, stress due to the application of the first and the second tapes 1, 2 may increase. As a result, to increase the adhesive strength of the first and the second tapes 1, 2 that are applied to the semiconductor wafer 10, preferably, the tape annealing may be performed to the semiconductor wafer 10 in a state in which the first and the second tapes 1, 2 have been applied.

It is presumed that by performing the tape annealing for a predetermined period, the adhesive layers of the first and the second tapes 1, 2 are heated and become soft to be adhered, filling minute gaps between a base and the adhesive layers, whereby the adhesive strength with the base is enhanced. The period of the tape annealing that increases the adhesive strength of the first and the second tapes 1, 2 applied to the semiconductor wafer 10 may be, for example, about 30 minutes. The adhesive strength between the semiconductor wafer 10 and the first and the second tapes 1, 2 (hereinafter, initial adhesive strength) is increased by the tape annealing of about 30 minutes to an extent that the plating solution of the later-described plating process does not penetrate between the semiconductor wafer 10 and the second tape 2. Further, this is because the adhesive strength between the semiconductor wafer 10 and the first and the second tapes 1, 2 does not change from the initial adhesive strength when the tape annealing is performed for at most about three hours and even with the tape annealing exceeding three hours, the increase stays just under 10%.

The tape annealing, for example, may be performed under a nitrogen ($N_2$) atmosphere that does not oxidize the surface of the front electrode. The tape annealing may be performed by batch processing in which the semiconductor wafer 10 is placed in plural in a wafer cassette for collective processing or by single-wafer processing in which the semiconductor wafer 10 is processed singularly. The tape annealing may be a lamp heating in which an object is heated directly by a heating means such as an infrared lamp or a lamp heater or may be an atmosphere heat treatment in which an object is exposed to and heated indirectly in a heated atmosphere.

In an instance in which the tape annealing is lamp heating, for example, the semiconductor wafer 10 may be placed in a heating furnace (oven furnace, not depicted), and the semiconductor wafer 10 and the first and the second tapes 1, 2 may be heated indirectly. The semiconductor wafer 10 may be placed on a stage (hotplate, not depicted) that has been heated by a heating means, and the semiconductor wafer 10 and the first and the second tapes 1, 2 may be heated thereby. In this instance, a periphery of the hotplate may be covered, nitrogen gas of a predetermined flow amount may be passed through the interior, whereby a nitrogen ($N_2$) at atmosphere is created. On the hotplate, only the semiconductor wafer 10 may be heated and the first and the second tapes 1, 2 may be indirectly heated via the semiconductor wafer 10.

Next, for example, an electroless plating process is performed at a temperature of about 80 degrees C. to the semiconductor wafer 10 to which the first and the second tapes 1, 2 have been applied, thereby forming a plating layer (not depicted) on the surface of the surface electrode (front electrode, not depicted) of the front surface of the semiconductor wafer 10 (step S4, fifth process). The plating layer contains a metal having high adhesiveness with the solder layer such as, for example, nickel, and is formed between the front electrode having low adhesiveness with the solder layer and the external-connection terminal soldered on the front electrode by a subsequent process. A thickness of the plating layer may be, for example, about 5 μm.

Next, the second tape 2 (outer periphery tape) is peeled from the outer peripheral portion 12 of the semiconductor wafer 10 (step S5, FIGS. 4, 5: sixth process). In particular, the semiconductor wafer 10 is attached to an attachable stage (not depicted), and the semiconductor wafer 10 being fixed thereto with the back surface 10b facing the stage. Subsequently, the stage is rotated in state in which UV light 3 is irradiated from the front surface 10a of the semiconductor wafer 10 to multiple points (in FIG. 4, 3 points) of the second tape 2 in the outer peripheral portion 12 of the semiconductor wafer 10, whereby the UV light 3 is irradiated to the entire periphery of the second tape 2 in the outer peripheral portion 12 of the semiconductor wafer 10.

In this manner, the UV light 3 is irradiated to the entire periphery of the second tape 2, a portion of the adhesive layer of the second tape 2 attached to the front surface 10a of the semiconductor wafer 10 is hardened, and the adhesive strength (peel strength of the second tape 2) with respect to the front surface 10a of the semiconductor wafer 10 is reduced. In FIG. 4, as a central axis, the stage rotates around a column-shaped holding part 4 that holds the stage which has a circular shape in a plan view thereof, and a direction of rotation of the stage along the circumference is indicated by an arrow. The protruding portion 2a of the second tape 2 is pulled, whereby the second tape 2 is peeled from the semiconductor wafer 10. An arrow 2b in FIG. 5 indicates a direction in which the protruding portion 2a is pulled.

Use of the UV tape as the second tape 2 enables removal so that no portion of the adhesive layer remains on the front surface 10a of the semiconductor wafer 10. Further, the adhesive layer of the second tape 2 is irradiated with the UV light 3 and hardened and therefore, even when a portion of the adhesive layer of the second tape 2 remains on the front surface 10a of the semiconductor wafer 10, the semiconductor wafer 10 may be prevented from sticking to a transport means during a subsequent process. Further, the second tape 2 is applied to the first tape 1 on the back surface 10b of the semiconductor wafer 10 and after the second tape 2 is peeled, a portion of the adhesive layer of the second tape 2 may be left on the surface of the first tape 1. Therefore, UV light irradiation need not be performed to the second tape 2 from the back surface 10b of the semiconductor wafer 10.

Next, the first tape 1 (back surface tape) is peeled from the back surface 10b of the semiconductor wafer 10 (step S6, FIG. 6). In particular, UV light (not depicted) is irradiated to the first tape 1 from the back surface 10b of the semiconductor wafer 10, the adhesive layer of the first tape 1 is hardened, and the adhesive strength (peel strength of the first tape 1) with respect to the outermost surface of the back surface 10b of the semiconductor wafer 10 is reduced. Further, for example, another tape 5 is applied near the end of the first tape 1 and this tape 5 is pulled up, thereby peeling the first tape 1. In FIG. 6, arrow 5a indicates a pulling direction of the tape 5.

The adhesive layer of the first tape 1 is irradiated with the UV light 3 and hardened, thereby enabling removal so that no portion of the adhesive layer remains on the back surface 10b of the semiconductor wafer 10. Nonetheless, even when a portion of the adhesive layer of the first tape 1 remains on the outermost surface of the back surface 10b of the semiconductor wafer 10, the semiconductor wafer 10 may be prevented from sticking to a transport means or stage during a subsequent process. Thereafter, the chip regions of the semiconductor wafer 10 are cut (diced) into individual chips as the semiconductor chips, whereby the semiconductor device having a predetermined device element structure is completed.

At step S4 described above, while an instance in which the plating process is performed using an electroless plating method is described as an example, without limitation hereto, for example, an electroplating method may be used. Further, the plating layer formed on the front surface of the front electrode is not limited to a nickel-plating layer or a metal plating layer and may be variously modified. Further, in an instance in which multiple front electrodes (electrode pads) are arranged in a single chip region, plating layers may be formed for all of these front electrodes.

Figure 7:
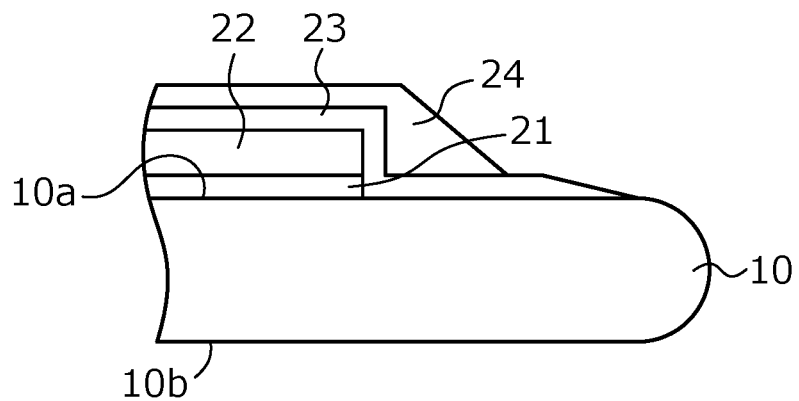
FIG. 7 is a cross-sectional view depicting an example of the front device element structures of the semiconductor wafer to which the method of manufacturing the semiconductor device according to the embodiment is applied.
Figure 8:
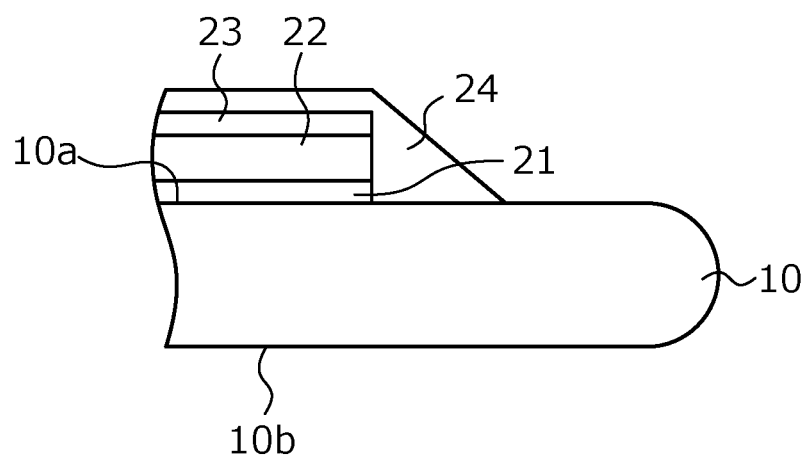
FIG. 8 is a cross-sectional view depicting an example of the front device element structures of the semiconductor wafer to which the method of manufacturing the semiconductor device according to the embodiment is applied.

FIGS. 7 and 8 are cross-sectional views depicting examples of the front device element structures of the semiconductor wafer to which the method of manufacturing the semiconductor device according to the embodiment is applied. In FIGS. 7 and 8, the front device element structures of the outer peripheral portion 12 of the semiconductor wafer 10 are depicted. The method of manufacturing the semiconductor device according to the embodiment described above is applicable to an instance in which a semiconductor device fabricated (manufactured) having in the center portion 11 of the semiconductor wafer 10 (refer to FIG. 2), the front device element structures (not depicted) with front electrodes exposed at the outermost surface of the front surface 10a of the semiconductor wafer 10.

At the end of the semiconductor wafer 10, the front surface 10a of the semiconductor wafer 10 may be covered by an insulating layer such as an initial oxide film 21, the interlayer insulating film 23, the passivation film 24 (FIG. 7), or may be exposed (FIG. 8). Reference numeral 22, for example, is a polysilicon layer configuring a diode, a gate runner of an MOSFET or IGBT. In the outer peripheral portion 12 of the semiconductor wafer 10, the front surface 10a of the semiconductor wafer 10 is exposed, whereby the adhesive strength of the second tape 2 (refer to FIG. 3) at the front surface 10a of the semiconductor wafer 10 may be increased. Nonetheless in any case, in the plating process, the plating solution may permeate between the back surface 10b of the semiconductor wafer 10 and the first tape 1 and an appearance defect may occur and therefore, the method of manufacturing the semiconductor device according to the present embodiment is useful.

As described above, according to the embodiment, after the second tape is applied in the outer peripheral portion of the semiconductor wafer but before the plating process, the first and the second tapes respectively applied to the back surface and the outer peripheral portion the semiconductor wafer are heated by a temperature of at least 40 degrees C. (the tape annealing). As a result, the adhesive strength of the first and the second tapes with respect to the semiconductor wafer may be increased, whereby an occurrence of appearance defects at the back electrode of the semiconductor wafer due to the plating solution of the plating process permeating between the first tape and the back surface of the semiconductor wafer may be prevented to enhance productivity.

Further, according to the embodiment, the adhesive strength between the semiconductor wafer and the first and the second tapes is increased, whereby automated reading of the wafer ID formed in the outer peripheral portion of the semiconductor wafer becomes possible and thus, productivity is enhanced. Further, according to the embodiment, the adhesive strength between the semiconductor wafer and the first and the second tapes is increased and therefore, abnormal deposition of a plating layer at the end of the semiconductor wafer may be suppressed. As a result, plating bath contamination, changes in bath composition over time, etc. may be suppressed and appearance defects of the semiconductor wafer may be suppressed, enhancing productivity.

Further, according to the embodiment, the first and the second tapes are a UV tape and when the first and the second tapes are peeled, the adhesive layers of the first and the second tapes are hardened by the UV irradiation and the adhesive strength is reduced. As a result, it is difficult for the adhesive layers of the first and the second tapes to partially remain on the surface of the semiconductor wafer. Further, even when the adhesive layers of the first and the second tapes partially remain on the surface of the semiconductor wafer, the adhesive layers are hardened by the UV irradiation, whereby the semiconductor wafer may be prevented from sticking to a transport means during a subsequent process. As a result, cracking of the semiconductor wafer may be suppressed, whereby productivity is enhanced.

Even with a conventional method in which the tape annealing is not performed, a semiconductor wafer to which the second tape has been applied is left standing as is at room temperature immediately after application of the second tape (=0 time) for two hours or longer, whereby the adhesive strength between the semiconductor wafer and the second tape increases. In particular, the adhesive strength between the semiconductor wafer and the second tape increases as the time that the semiconductor wafer left standing at room temperature and even in an instance in which the tape annealing is not performed, the inventors confirmed that the adhesive strength is increased to an extent that the plating solution of the plating process does not penetrate between the semiconductor wafer and the second tape by leaving the semiconductor wafer as is, for example, for about 17 hours immediately after application of second tape.

In this manner, even in the conventional method, by leaving the semiconductor wafer in a state in which the first and the second tapes are applied thereto for a long period before the plating process, the adhesive strength between the semiconductor wafer and the first and the second tapes may be increased; however, the longer is the period that the semiconductor is left standing as is, the more likely adhesion of foreign particles, such as dust, that cause defects of the semiconductor wafer is to occur. Further, during mass production, the semiconductor wafers have to be removed from the production line and set aside (stored) and therefore, a storage place for the semiconductor wafers removed from the production line has to be established and time management of the production line may become complicated.

On the other hand, according to the embodiment, as described above, after application of the second tape but before the plating process, the adhesive strength between the semiconductor wafer and the first and the second tapes may be increased by the tape annealing. Therefore, the semiconductor wafers need not be removed from the production line and set aside, thereby enabling sequential input from a previous process to a subsequent process. Thus, adhesion of foreign particles, such as dust, that causes defects of the semiconductor wafers may be suppressed. Further, during mass production, the above problems due to the semiconductor wafers being removed from the production line and set aside do not occur.

Figure 9:
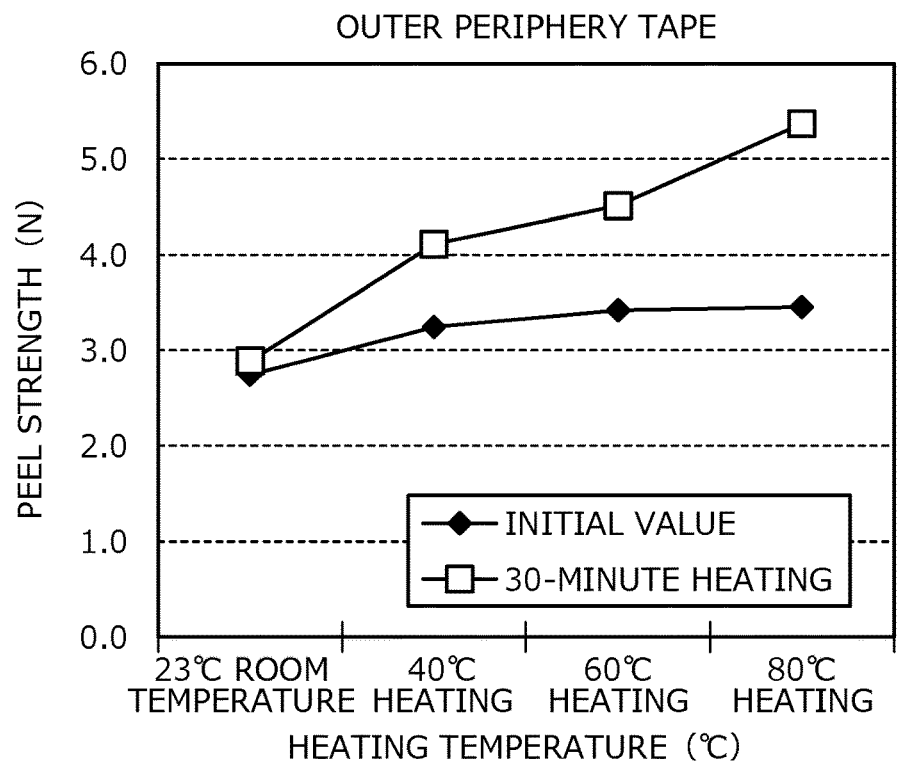
FIG. 9 is a characteristics diagram depicting a relationship between heating temperature and peel strength of a second tape (outer periphery tape) in a first experimental example.
Figure 10:
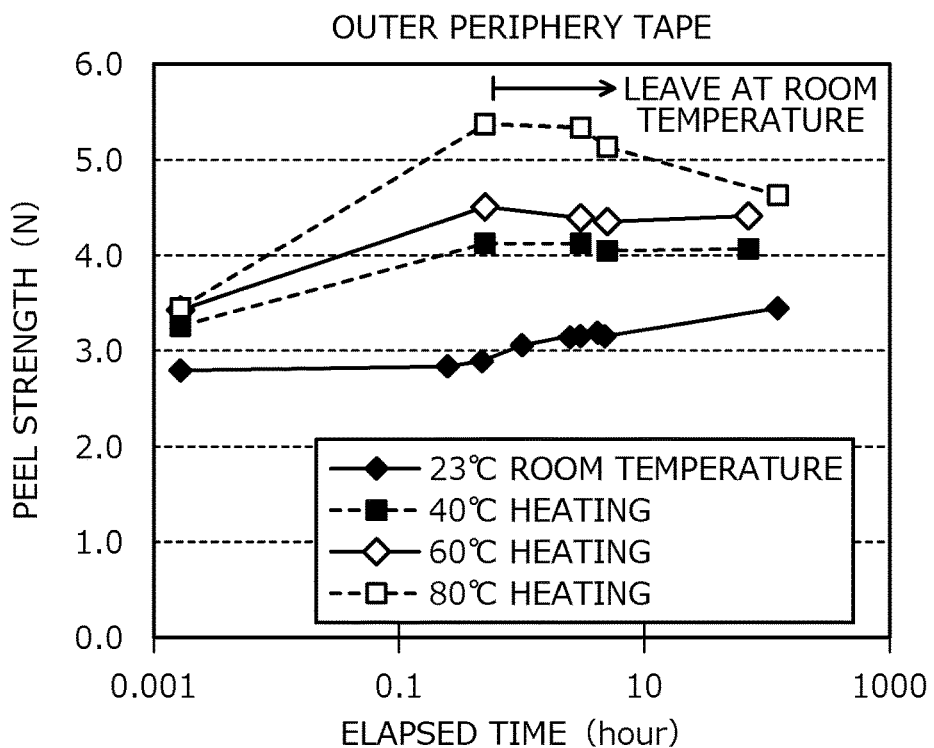
FIG. 10 is a characteristics diagram depicting a relationship between heating temperature and peel strength of the second tape (outer periphery tape) in the first experimental example.

The temperature (heating temperature) of the tape annealing (process at step S3 in FIG. 1) was verified. FIGS. 9 and 10 are characteristics diagrams depicting a relationship between heating temperature and peel strength of the second tape (outer periphery tape) in a first experimental example. For the second tape applied to the outer peripheral portion of the semiconductor wafer, the peel strength was measured immediately after the tape annealing and after standing for a predetermined period at room temperature (23 degrees C.) after the tape annealing (hereinafter, the first experimental example).

For the first experimental example, 3 samples (with heating) were fabricated to which the tape annealing was performed at 40 degrees C., 60 degrees C., and 80 degrees C. The tape annealing time for the samples with the tape annealing (with heating) of the first experimental example was 30 minutes (in FIG. 9, indicated as "30-minute heating"). A "23° C. room temperature" sample of the first experimental example is a sample without the tape annealing (no heating) and was left standing at room temperature (23 degrees C.) for 30 minutes after application of the second tape until the plating process.

Here, the first tape of the first experimental example was a UV tape and the second tape was a tape with a normal adhesive layer. A normal adhesive layer is an adhesive layer that is not an adhesive layer that is hardened by ultraviolet (UV) irradiation to reduce the adhesive strength. For the second tape, even in an instance in which a UV tape is used that transmits UV and has an adhesive layer that, by ultraviolet (UV) irradiation, is hardened and whose adhesive strength is reduced, results similar to those of the first experimental example were confirmed.

Further, for the samples of the first experimental example, the plating process was performed after the tape annealing (for the sample without the tape annealing, after waiting 30 minutes from the application of the second tape), and it was confirmed whether an appearance defect of the back electrode was present, whether abnormal deposition of the plating layer at the end of the semiconductor wafer was present, and whether the wafer ID could be automatically read. For the samples of the first experimental example, methods of applying the second tape and performing the tape annealing and plating process were performed according to the method of manufacturing the semiconductor device according to the embodiment described above (refer to FIGS. 1 to 6). The plating process was not actually performed for the samples for which peel strength was evaluated.

For the samples of the first experimental example, the relationship between heating temperature and peel strength for the second tape is depicted in FIG. 9. A relationship between standing time (elapsed time) at room temperature after heating of the second tape and peel strength is depicted in FIG. 10. In FIG. 9, for comparison, the peel strength of the second tape before the tape annealing is also shown for the samples of the first experimental example (in FIG. 9, indicated as "initial value"). In the first experimental example, for the sample without the tape annealing, the same result was obtained for the initial value of the peel strength and for the peel strength with 30-minute heating (i.e., 30-minute standing), for the second tape.

From the results depicted in FIG. 9, it was confirmed that the peel strength of the second tape was increased by the tape annealing. A method of measuring the peel strength of the second tape is described hereinafter. Further, as a result of performing the plating process on the sample of the first experimental example without the tape annealing, permeation of the plating solution between the back surface of the semiconductor wafer and the first and the second tapes and occurrence of appearance defects was confirmed (refer to FIGS. 16A, 16B, 17A, and 17B). In addition to this, a plating layer was abnormally deposited on the end of the semiconductor wafer (not depicted). It was confirmed that the wafer ID could not be automatically performed.

On the other hand, for the samples of the first experimental example with the tape annealing, as a result of performing the plating process after the tape annealing, in all of the samples having the tape annealing, it was confirmed that permeation of the plating solution between the back surface of the semiconductor wafer and the first tape did not occur. In addition to this, it was confirmed that abnormal deposition of a plating layer at the end of the semiconductor wafer did not occur and the wafer ID could be automatically read (not depicted). The peel strength at this time was at least 3.0N.

Further, in the samples of the first experimental example having the tape annealing, it was confirmed that the adhesive layer of the second tape was partially left on the surface of the semiconductor wafer. This is because a normal adhesive layer was used for the second tape. As described hereinafter, for the second tape, by using the UV tape that transmits UV and has an adhesive layer that, by ultraviolet (UV) irradiation, is hardened and whose adhesive strength is reduced, the adhesive layer may be suppressed from being left partially on the surface of the semiconductor wafer.

Further, in FIG. 10, in the elapsed time (horizontal axis), for the initial 30 minutes, the tape annealing is performed at a predetermined temperature and thereafter, are results for standing at room temperature. For the room temperature of 23 degrees C., the results are for standing without the tape annealing. From the results depicted in FIG. 10, for the second tape of the samples of the first experimental example having the tape annealing, it was confirmed that the peel strength after the tape annealing increased; however, thereafter with standing at room temperature, even when the standing time is long, the peel strength did not change substantially. In the instance in which the temperature of the tape annealing was 80 degrees C., it was confirmed that the peel strength of the second tape tended to slightly decrease when the standing time became longer.

Further, in the instance in which the tape annealing was not performed, it was confirmed that when the standing time at room temperature after application of the second tape became longer, the peel strength of the second tape increased. In the first experimental example, while results for the second tape are shown, for the first tape, similar results with respect to heating temperature and peel strength were confirmed.

From the results above, it was confirmed that the peel strength of the second tape could be increased by the tape annealing and is dependent on the temperature of the tape annealing and substantially independent of the standing time at room temperature after the tape annealing. Therefore, by adjusting the temperature of the tape annealing, the peel strength of the second tape may be adjusted to a predetermined value. By performing the tape annealing after application of the second tape, the plating process may be performed at an arbitrary timing after the tape annealing, thereby increasing the degrees of freedom in time management after the tape annealing until the plating process.

Figure 11:
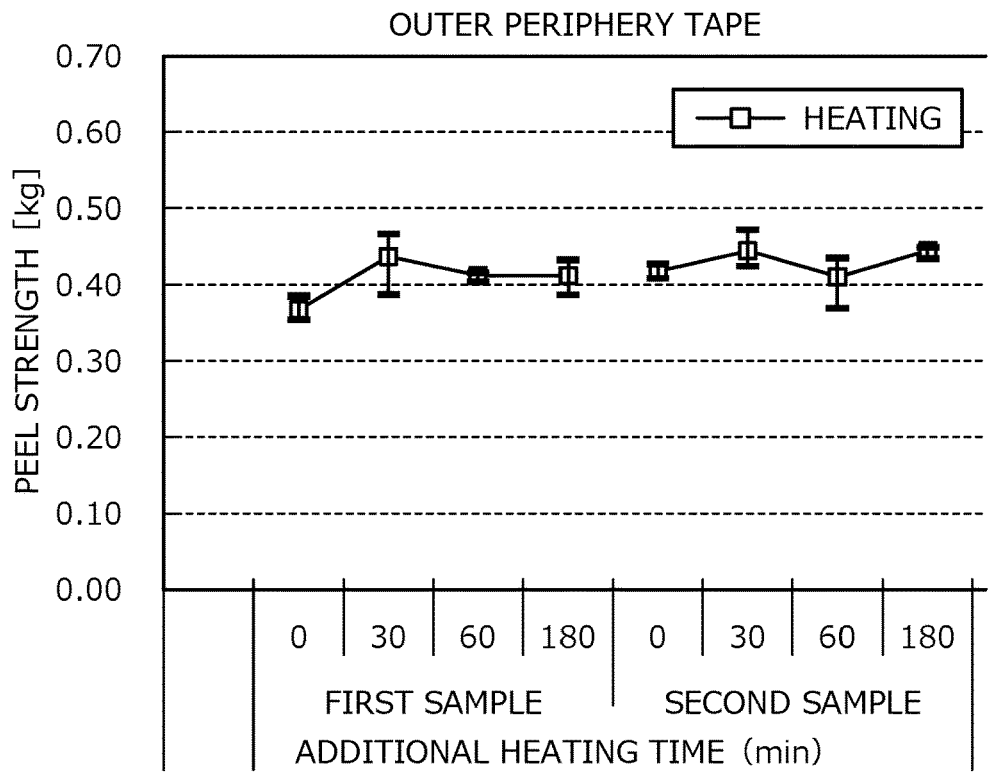
FIG. 11 is a characteristics diagram depicting a relationship between heating time and peel strength of the second tape (outer periphery tape) in a second experimental example.
Figure 12:
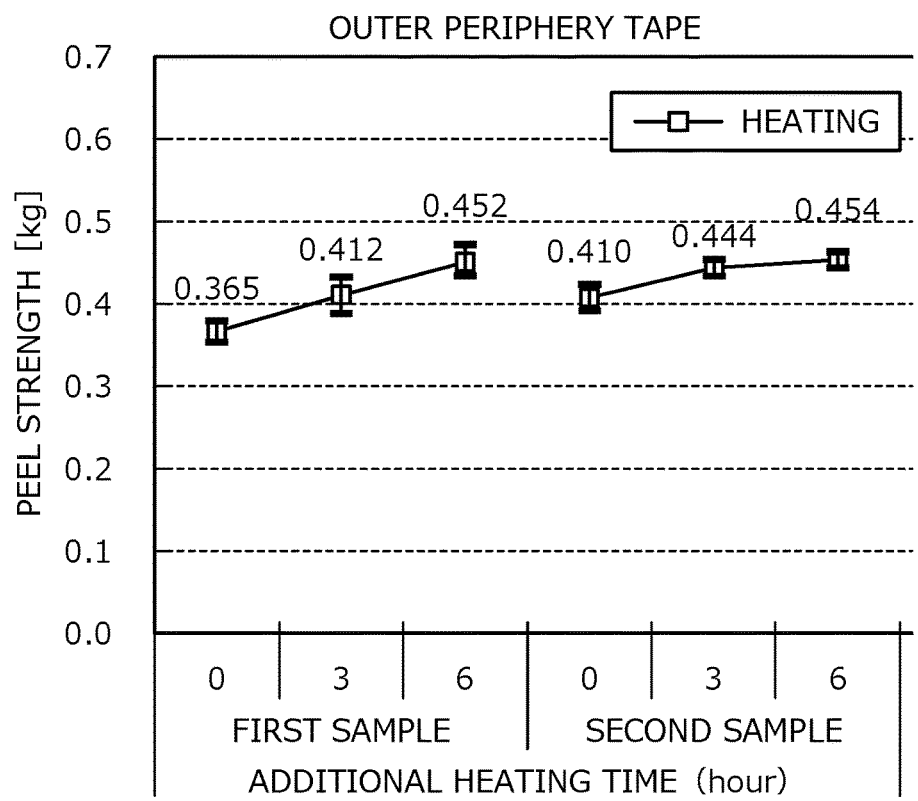
FIG. 12 is a characteristics diagram depicting a relationship between heating time and peel strength of the second tape (outer periphery tape) in the second experimental example.

The time (heating time) of the tape annealing was verified. FIGS. 11 and 12 are characteristics diagrams depicting a relationship between heating time and peel strength of the second tape (outer periphery tape) in a second experimental example. The adhesive strength (peel strength of the first and the second tapes) between the semiconductor wafer and the first and the second tapes (back surface tape and outer periphery tape) was increased by the 30-minute tape annealing (hereinafter, initial tape annealing) and thereafter, the peel strength of the second tape was measured after the tape annealing (hereinafter, additional tape annealing) was performed for a predetermined time (hereinafter, the second experimental example).

As samples of the second experimental example with the tape annealing (with heating), in a first measurement, a sample of only the initial tape annealing (elapsed time=0 minutes), and 3 samples for which the additional tape annealing was performed for an additional 30 minutes (min), 60 minutes, and 180 minutes after the initial tape annealing were fabricated. In a second measurement, a sample for only the initial tape annealing and 2 samples for which the additional tape annealing was performed for 3 hours (hour) and 6 hours after the initial tape annealing were fabricated. For the samples of the second experimental example, the temperature of the tape annealing was 60 degrees C.

The second tape of the samples of the second experimental example was a tape having a normal adhesive layer. Under the same conditions of the first and the second measurements, 2 samples each (hereinafter, first and second samples) were fabricated. For each of the samples of the second experimental example, methods of applying the first and the second tapes and performing the tape annealing and the plating process were performed according to the method of manufacturing the semiconductor device according to the embodiment described above (refer to FIGS. 1 to 6). The plating process was not actually performed for the samples for which peel strength was evaluated.

From the results depicted in FIGS. 11 and 12 the peel strength of the second tape of the samples of the second experimental example with the tape annealing was confirmed to not change from the initial peel strength with tape annealing up to about 3 hours and even with the tape annealing exceeding 3 hours but not more than 6 hours, the peel strength increased only about 10%. The initial peel strength is the peel strength with only the initial tape annealing. No remarkable improvement of the peel strength occurred even when the annealing time for the tape annealing was changed to a minimum of 30 minutes. From these experimental results, the annealing time is preferably 20 minutes to 40 minutes with consideration of throughput.

Figure 13:
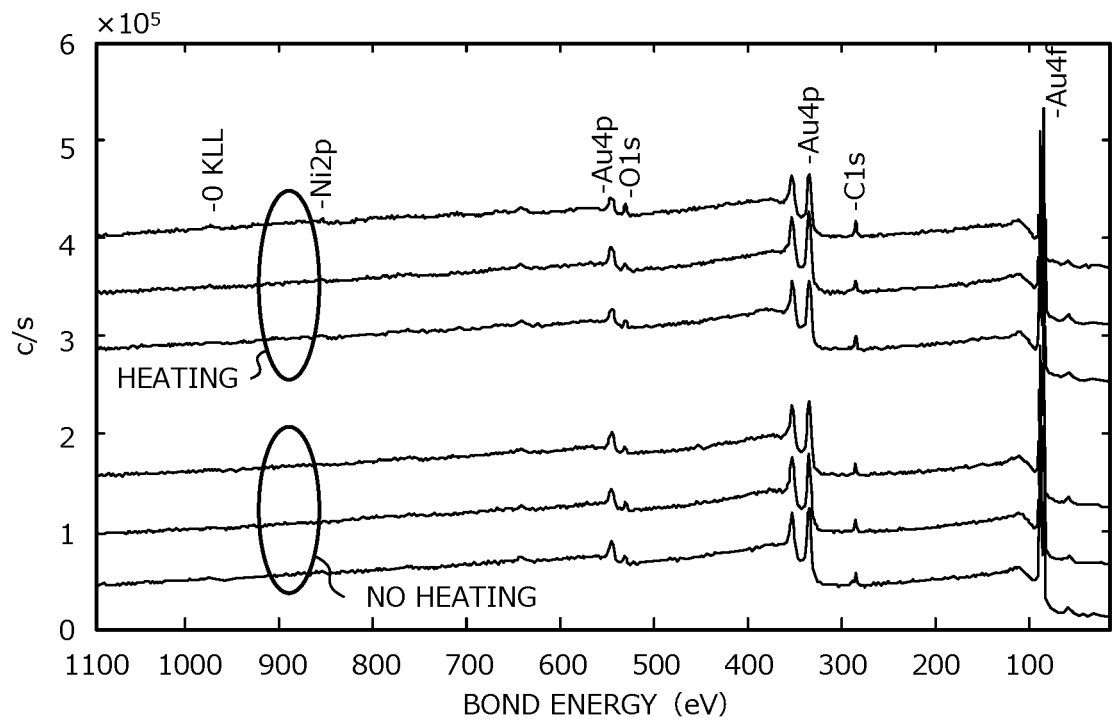
FIG. 13 is a graph depicting composition analysis results for back electrodes in a third experimental example.
Figure 14:
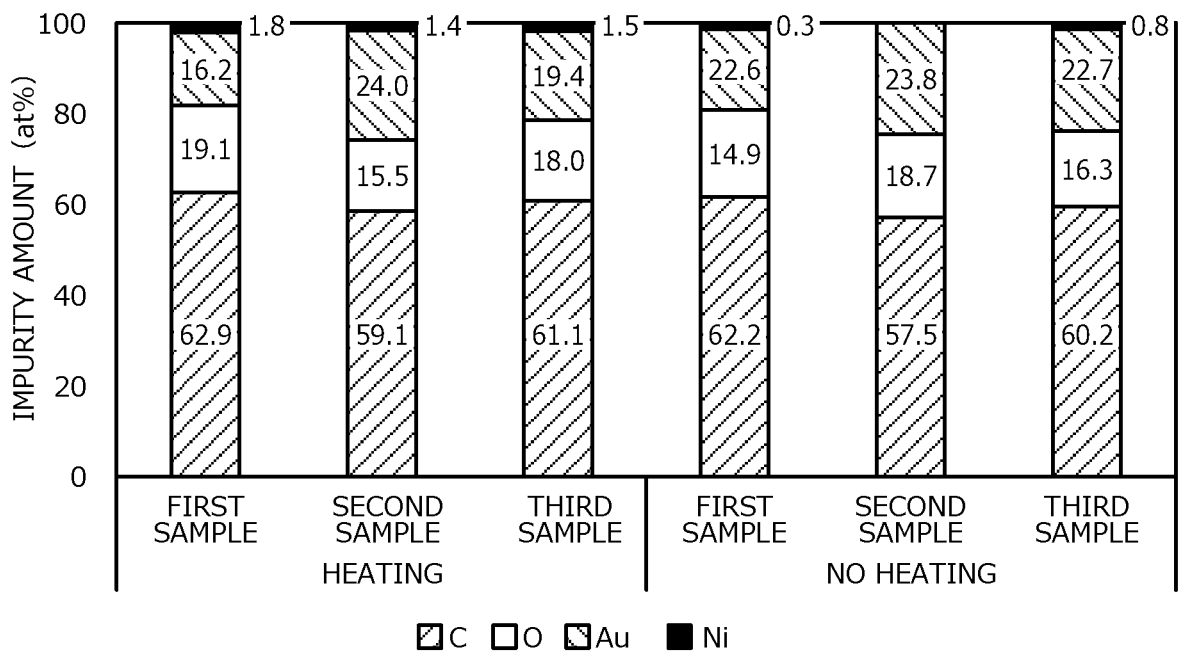
FIG. 14 is a graph depicting composition analysis results for the back electrodes in the third experimental example.

The state of the surface electrode (back electrode) protected by the UV tape (first tape: back surface tape) was verified after performing the tape annealing and the UV tape peeling, FIGS. 13 and 14 are graphs depicting composition analysis results for back electrodes in a third experimental example. In FIG. 13, photoelectron spectra (wide spectra) for the back electrodes measured by electron spectroscopy for chemical analysis (ESCA) is depicted. In FIG. 14, composition ratios of the back electrodes obtained from FIG. 13 are depicted.

Results of composition analysis measurement by ESCA for the back electrodes after peeling of the first tapes of samples fabricated according to the method of manufacturing the semiconductor device according to the embodiment described above (refer to FIGS. 1 to 6) (hereinafter, the third experimental example) are indicated as "heating" in FIGS. 13 and 14. Further, in FIGS. 13 and 14, samples for which the tape annealing is not performed are indicated as "no heating". The first tapes (back surface tapes) of the samples of the third experimental example were UV tapes and the annealing temperature and time for the samples with the tape annealing were 80 degrees C. and 30 minutes, respectively. Here, the UV irradiation is performed when the first tape is peeled.

Other than the tape annealing not being performed, conditions for the samples of the third experimental example without the tape annealing (without heating) were similar to those for the samples of the third experimental example with the tape annealing. In the third experimental example, 3 samples with the tape annealing and 3 samples without the tape annealing were fabricated under the same conditions (hereinafter, first to third samples). The back electrodes in the third experimental example had a stacked structure in which an aluminum layer, a titanium (Ti) layer, a nickel (Ni) layer, and a gold (Au) layer were sequentially stacked. Analytical diameter (diameter) of the ESCA for the third experimental example was 100 μm.

From the results depicted in FIGS. 13 and 14, it was confirmed that the composition ratios of the back electrodes were substantially the same for the samples of the third experimental example with the tape annealing and without the tape annealing, and the back electrodes were not adversely affected by the tape annealing. In FIG. 13, the composition ratios of the back electrodes were ratios of impurity amounts (semi-quantitative values) of the back electrodes. Further, it was confirmed that an amount of carbon (C) of the back electrodes of the samples of the third experimental example with the tape annealing was substantially a same as an amount of carbon of the back electrodes of the samples of the third experimental example without the tape annealing, and even when the tape annealing is performed, the adhesive layer of the first tape is not left on the surface of the back electrode.

The results for the second and the third experimental examples are obtained in an instance in which, in the method of manufacturing the semiconductor device according to the embodiment described above, the temperature of the tape annealing (process at step S3 in FIG. 1) is in a range from about 40 degrees C. to 80 degrees C. The peel strength of the second tape in the first and the second experimental examples is the peel strength with respect to silicon (Si) and corresponds to an instance in which the front surface of the semiconductor wafer is exposed at the end of the semiconductor wafer (refer to FIG. 8); however, even in an instance in which the front surface of the semiconductor wafer at the end of the semiconductor wafer is covered by an insulating layer (refer to FIG. 7), results similar to the results for the first to the third experimental examples are obtained.

Figure 15:
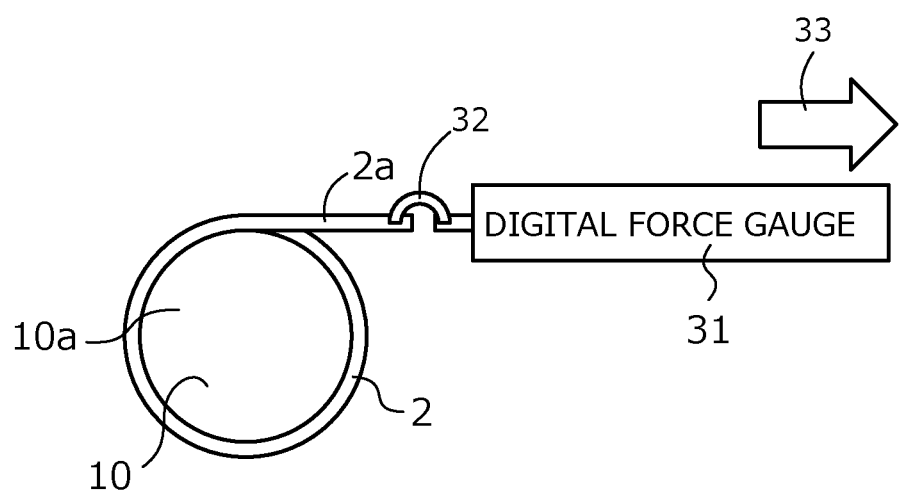
FIG. 15 is diagram schematically depicting a method of measuring the peel strength of the second tape of a fourth experimental example.

As a fourth experimental example, a method of measuring the peel strength of the second tape (outer periphery tape) in the first and the second experimental examples is described. FIG. 15 is diagram schematically depicting the method of measuring the peel strength of the second tape of the fourth experimental example. A state when the peel strength of the second tape is measured for a sample to which the first tape 1 (back surface tape) and the second tape 2 (outer periphery tape) are applied (hereinafter, the fourth experimental example) according to the method of manufacturing the semiconductor device according to the embodiment (steps S1, S2 in FIG. 1; FIGS. 2, 3) described above is depicted in FIG. 15.

As depicted in FIG. 15, first, the fourth experimental example (the semiconductor wafer 10 to which the first and the second tapes 1, 2 are applied) is placed on an attachable stage (not depicted) with the back surface 10b facing the stage and the semiconductor wafer 10 is fixed thereto. Next, the protruding portion 2a of the second tape 2 is wrapped around a hook 321 of a general digital force gauge 31. Next, the digital force gauge 31 is pulled in a direction to peel the second tape 2 (arrow 2b in FIG. 5). As a result, a force 33 (indicated by white arrow) when the second tape 2 begins to peel is regarded as the peel strength of the second tape 2.

While not depicted, the peel strength of the first tape 1 may be measured similarly to the method of measuring the peel strength of the second tape 2 described above. In particular, for example, a first end of the other tape 5 (refer to FIG. 6) is applied near the end of the first tape 1 and a second end of the tape 5 is wrapped around the hook 321 of the digital force gauge 31 (refer to FIG. 15). Thereafter, the digital force gauge 31 is pulled in a direction to peel the first tape 1 (arrow 5a in FIG. 6) and the force 33 when the first tape 1 begins to peel (refer to FIG. 15) may be regarded as the peel strength of the first tape 1.

In the foregoing, various modifications within a range not departing from the spirit of the invention are possible, and device element structures, materials of electrodes/plating layers, positions where the plating layers are formed (main surface of the semiconductor wafer), constituent materials/dimensions of the first and the second tapes, etc. are variously set according to necessary specifications. For example, in a state in which the front surface and the outer peripheral portion of the semiconductor wafer are protected by tape, a plating layer may be formed on the back surface of the semiconductor wafer. Further, even in an instance in which the first tape is applied to the back surface (or the front surface) of the semiconductor wafer after the second tape is applied to the outer peripheral portion of the semiconductor wafer, similar effects are achieved. Even in an instance in which the first and the second tapes are applied to a semiconductor wafer having a substantially uniform thickness instead of a rib-shaped semiconductor wafer, similar effects are achieved.

According to the invention described above, the adhesive strength between the semiconductor wafer and the first and the second tapes may be increased and therefore, in the plating process, permeation of the plating solution between the back surface of the semiconductor wafer and the first tape, and the occurrence of an appearance defect at the back electrode of the semiconductor wafer due to the plating solution may be suppressed.

The method of manufacturing a semiconductor device according to the present invention achieves an effect in that productivity may be increased.

As described above, the method of manufacturing a semiconductor device according to the present invention is useful for semiconductor devices in which a surface electrode is exposed at an outermost surface of at least one main surface of a semiconductor substrate (semiconductor chip).

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A method of manufacturing a semiconductor device, comprising:
    preparing a semiconductor wafer, the semiconductor wafer having a first main surface and a second main surface opposite to each other;
    forming a first electrode on the first main surface of the semiconductor wafer;
    applying a first tape to the second main surface of the semiconductor wafer, so as to cover the second main surface of the semiconductor wafer with the first tape;
    applying a second tape to an outer peripheral portion of the semiconductor wafer, to thereby cover the outer peripheral portion of the semiconductor wafer with the second tape;
    heating the semiconductor wafer having the first tape and the second tape applied thereto, by a heat treatment that is performed for in a range from 20 minutes to 40 minutes at a temperature of at least 40 degrees C. but less than 60 degrees C.; and
    forming a plating layer on a surface of the first electrode after heating the semiconductor wafer, wherein
    the first main surface of the semiconductor wafer in the outer peripheral portion thereof is exposed to an exterior of the semiconductor wafer, and
    the applying the second tape includes applying the second tape to the outer peripheral portion of the semiconductor wafer in such a way that the second tape is applied directly on the first main surface of the semiconductor wafer at the outer peripheral portion thereof.

2. The method according to claim 1, wherein
    the second tape has an adhesive layer that is hardenable by ultraviolet irradiation, to thereby reduce adhesive strength thereof,
    the second tape extends from the first main surface of the semiconductor wafer to the second main surface of the semiconductor wafer, and
    the method further includes:
    applying the ultraviolet irradiation to harden the adhesive layer of the second tape after forming the plating layer; and
    peeling the second tape from the semiconductor wafer after applying the ultraviolet irradiation.

3. The method according to claim 2, wherein
    the second tape is so applied as to extend from the first main surface of the semiconductor wafer to the second main surface of the semiconductor wafer, and to overlap the first tape in the outer peripheral portion of the semiconductor wafer at the second main surface of the semiconductor wafer, and
    the second tape is peeled after the adhesive layer of the second tape applied to the first main surface of the semiconductor wafer is hardened by the ultraviolet irradiation from the first main surface of the semiconductor wafer.

4. The method according to claim 1, wherein
    the second tape is applied to go around the outer peripheral portion of the semiconductor wafer at least one time.

5. The method according to claim 1, wherein
    the heating the semiconductor wafer includes inserting the semiconductor wafer in a heating furnace and directly heating the first tape and the second tape.

6. The method according to claim 1, wherein
    the heating the semiconductor wafer includes heating a stage by a heating means, and placing the semiconductor wafer on the heated stage, to thereby heat the first tape and the second tape.

7. The method according to claim 5, wherein
    the heating the semiconductor wafer includes heating the semiconductor wafer in a nitrogen atmosphere.

8. The method according to claim 6, wherein
    the heating the semiconductor wafer includes heating the semiconductor wafer in a nitrogen atmosphere.

9. The method according to claim 1, further comprising
    forming a second electrode on the second main surface of the semiconductor wafer, wherein
    the applying the first tape to the second main surface of the semiconductor wafer includes covering the second electrode with the first tape.

10. The method according to claim 1, wherein
    the semiconductor wafer has a center portion surrounded by the outer peripheral portion, and is of a rib-shape in a cross-sectional view thereof, a thickness of the semiconductor wafer being thinner in the center portion thereof than in the outer peripheral portion thereof.

11. The method according to claim 1, wherein
    the heating the semiconductor wafer is performed by batch processing in which a plurality of semiconductor wafers are placed in a wafer cassette and the heat treatment is performed correctively on the plurality of semiconductor wafers.

* * * * *